US010326956B2

(12) United States Patent
Nayar et al.

(10) Patent No.: US 10,326,956 B2
(45) Date of Patent: *Jun. 18, 2019

(54) CIRCUITS FOR SELF-POWERED IMAGE SENSORS

(71) Applicant: The Trustees of Columbia University in the City of New York, New York, NY (US)

(72) Inventors: Shree K. Nayar, New York, NY (US); Daniel Sims, Franklin Park, NJ (US); Mikhail Fridberg, Sharon, MA (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/036,552

(22) Filed: Jul. 16, 2018

(65) Prior Publication Data
US 2018/0343407 A1 Nov. 29, 2018

Related U.S. Application Data

(63) Continuation of application No. 15/538,556, filed as application No. PCT/US2016/012509 on Jan. 7, 2016, now Pat. No. 10,027,914.

(Continued)

(51) Int. Cl.
*H04N 5/369* (2011.01)
*H04N 5/378* (2011.01)
(Continued)

(52) U.S. Cl.
CPC ..... *H04N 5/3698* (2013.01); *H01L 27/14609* (2013.01); *H01L 27/14612* (2013.01);
(Continued)

(58) Field of Classification Search
CPC .... H04N 5/3698; H04N 5/378; H01L 31/053; H01L 27/14609; H01L 27/14643
See application file for complete search history.

(56) References Cited

U.S. PATENT DOCUMENTS 6,803,553 B1 10/2004 Tian
7,405,763 B2 7/2008 Wu
(Continued)

OTHER PUBLICATIONS

Ay, Suat, "A CMOS Energy Harvesting and Imaging (EHI) Active Pixel Sensor (APS) Imager for Retinal Prosthesis", in IEEE Transaction on Biomedical Curcuits and Systems, vol. 5, issue 6, Dec. 2011, pp. 535-545.

(Continued)

*Primary Examiner* — Nelson D. Hernández Hernández
(74) *Attorney, Agent, or Firm* — Byrne Poh LLP

(57) ABSTRACT

Circuits for self-powered image sensors are provided. In some embodiments, an image sensor is provided, the image comprising: a plurality of pixels, each of the plurality of pixels comprising: a photodiode having an anode and a cathode connected to a constant voltage level; a first transistor having: a first input connected to the anode of the photodiode; a first output connected to a reset bus; and a first control configured to receive a discharge signal; and a second transistor having: a second input connected to the anode of the photodiode; a second output connected to a pixel output bus; and a second control configured to receive a select signal; and a third transistor having: a third input coupled to each first output via the reset bus; a third output configured to be coupled to an energy storage device; and a third control configured to receive an energy harvest signal.

20 Claims, 7 Drawing Sheets

Related U.S. Application Data

(60) Provisional application No. 62/100,871, filed on Jan. 7, 2015.

(51) Int. Cl.
  *H01L 27/146* (2006.01)
  *H01L 31/053* (2014.01)

(52) U.S. Cl.
  CPC ...... *H01L 27/14643* (2013.01); *H01L 31/053* (2014.12); *H04N 5/378* (2013.01)

(56) References Cited

U.S. PATENT DOCUMENTS

| | | | |
|---|---|---|---|
| 7,936,393 | B2 | 5/2011 | Yamazaki et al. |
| 7,936,394 | B2 | 5/2011 | Wu |
| 8,101,900 | B2 | 1/2012 | Bergmann et al. |
| 8,436,288 | B2 | 5/2013 | Augusto |
| 8,629,386 | B2 | 1/2014 | Bermak et al. |
| 8,884,205 | B2 | 10/2014 | Lee |
| 10,027,914 | B2 * | 7/2018 | Nayar ............... H01L 27/14612 |
| 2010/0219789 | A1 | 9/2010 | Bermak et al. |
| 2010/0270459 | A1 | 10/2010 | Augusto |
| 2013/0140441 | A1 | 6/2013 | Innocent |

OTHER PUBLICATIONS

Chute, C., "Worldwide Digital Camera 2014-2018 Forecast Update", International Data Corporation, Oct. 2014, pp. 1-29.

Fish et al., "CMOS Image Sensors with Self-Power Generation Capability", in IEEE Transactions on Circuits and Systems II, vol. 53, issue 11, Nov. 13, 2006, pp. 1210-1214.

Fish et al., "Self-Powered Active Pixel Sensors for Ultra Low-Power Applications", in the Proceedings of the IEEE International Symposium on Circuts and Systems, Kobe, JP, May 23-26, 2005, pp. 5310-5313.

International Preliminary Report on Patentability and Written Opinion dated Jul. 20, 2017 in International Application No. PCT/US2016/012509.

International Search Report and Written Opinion dated May 17, 2016 in International Patent Application No. PCT/US2016/012509.

Law et al., "A Low-Power Energy-Harvesting Logarithmic CMOS Image Sensor With Reconfigurable Resolution Using Two-Level Quantization Scheme", in IEEE Transactions on Circuits and Systems II, vol. 58, issue 2, Feb. 14, 2011, pp. 80-84.

Nicodemus et al., "Geometrical Considerations and Nomenclature for Reflectance", in National Bureau of Standards, Oct. 1977, pp. 1-67.

Notice of Allowance dated Mar. 16, 2018 in U.S. Appl. No. 15/538,556.

Shi et al., "1.2-V Reconfigurable Resolution CMOS Image Sensor with Energy Harvesting Capability", in IEEE 2nd Asia Symposium on Quality Electrnoic Design, 2010, pp. 208-209.

Shi et al., "A Novel Asynchronous Pixel for an Energy Harvesting CMOS Image Sensor", in IEEE Transactions of Very Large Scale Integration Systems, vol. 19, issue 1, Jan. 2011, pp. 118-129.

Vargas-Sierra et al., "Pixel Design and Evaluation in CMOS Image Sensor Technology", in Proceedings of 24th Conference on Design of Circuits and Integrated Systems, Zaragoza, ES, 2009, pp. 1-6.

\* cited by examiner

CIRCUITS FOR SELF-POWERED IMAGE SENSORS

CROSS-REFERENCE TO RELATED APPLICATION

This application is a continuation of U.S. patent application Ser. No. 15/538,556, filed Jun. 21, 2017, which is a national stage application under 35 U.S.C. § 371 of International Patent Application No. PCT/US2016/012509, filed Jan. 7, 2016, which claims the benefit of U.S. Provisional Patent Application No. 62/100,871, filed Jan. 7, 2015, each of which is hereby incorporated by reference herein in its entirety.

STATEMENT REGARDING FEDERALLY SPONSORED RESEARCH OR DEVELOPMENT

This invention was made with government support under grant N00014-14-1-0741 awarded by the NAVY/ONR. The government has certain rights in the invention.

TECHNICAL FIELD

The disclosed subject matter relates to circuits for self-powered image sensors.

BACKGROUND

In the last year, roughly two billion digital imaging systems were sold worldwide, and over a trillion images are now on the Internet. In addition to photography, digital imaging is transforming numerous fields, including entertainment, social networking, ecommerce, security and autonomous navigation. In the coming years, ubiquitous digital imaging systems may transform diverse fields such as personalized medicine, wearable devices, smart environments, situational awareness, sensor networks and scientific imaging.

Conventional image sensors often use pixels that include photodiodes operating in photoconductive mode to generate image data. For example, FIG. 1 shows an example of a conventional three transistor (3T) pixel. As shown in this figure, conventional pixel 100 can include a photodiode 102 with the anode connected to ground and the cathode connected to a source of a reset transistor 104 and a gate of a source follower transistor 106. A drain of reset transistor 104 is connected to a voltage $V_{dd}$ and a gate of reset transistor 104 is connected to a reset line to which a reset signal $V_{res}$ can be applied. A drain of source follower transistor 106 is connected the $V_{dd}$ and a source of source follower transistor 106 is connected to a drain of a read-out transistor 108. A gate of read-out transistor 108 can be connected to a row selection line to which a selection signal $V_{sel}$ can be applied, and a source of read-out transistor 108 can be connected to a column bus.

Before capturing image data with conventional pixel 100, a reset signal is applied to the gate of reset transistor 104, which causes voltage $V_{dd}$ to be applied to the cathode of photodiode 102. When the reset signal is removed, the voltage at the cathode of photodiode 102 is equal to $V_{dd}$, which reverse-biases photodiode 102. When light is incident on photodiode 102, a current is induced from the cathode to the anode and the voltage across photodiode 102 drops from $V_{dd}$ by an amount that is proportional to the incident light energy and exposure time. The voltage at the cathode is buffered by source follower transistor 106 and is read out to the column bus as $V_{out}$ when a signal $V_{sel}$ is applied to a read-out transistor 108.

An illustration of currents present in a photodiode is presented in FIG. 2. As shown, a photodiode is typically a P-N junction semiconductor which can be modeled as an ordinary diode D, with a capacitance C, shunt resistance $R_{sh}$, and series resistance $R_{se}$. When the photodiode is connected to an external load, current flows from the anode through the load and back to the cathode. The total current that flows through the photodiode is the sum of the photocurrent $I_{pd}$ (due to light) and the dark current $I_d$ (due to a bias voltage applied across the photodiode).

Conventional pixel 100 consumes power during reset and readout due to the application of $V_{dd}$, $V_{res}$ and $V_{sel}$. Additionally, due to the reverse bias of photodiode 102, a "dark" current is generated even when light is not incident on photodiode 102, which can cause noise in an image generated from $V_{out}$. Therefore, in order to operate an image sensor using conventional pixels 100, an external supply of power is required as the pixels each consume power during operation. Such an external power supply is typically either a power supply connected to an electrical grid, or a battery that is charged from the electrical grid. As such, image sensors using conventional pixels are not suitable for applications in which a power supply is inaccessible and/or applications in which it would be difficult to recharge a battery. Moreover, even in applications where a battery can be recharged and/or a power supply is accessible, use of image sensors using conventional pixels can be an undue drain on the available power supply, but are necessary due to a lack of a useful self-powered image sensors.

Accordingly, it is desirable to provide new circuits for self-powered image sensors.

SUMMARY

In accordance with various embodiments of the disclosed subject matter circuits for self-powered image sensors are provided.

In accordance with some embodiments of the disclosed subject matter, an image sensor is provided, the image sensor comprising: a plurality of pixels, each of the plurality of pixels comprising: a photodiode having an anode and a cathode connected to a constant voltage level; a first transistor having: a first input connected to the anode of the photodiode; a first output connected to a reset bus; and a first control configured to receive a discharge signal; and a second transistor having: a second input connected to the anode of the photodiode; a second output connected to a pixel output bus; and a second control configured to receive a select signal; and a third transistor having: a third input coupled to each first output via the reset bus; a third output configured to be coupled to an energy storage device; and a third control configured to receive an energy harvest signal.

In some embodiments, the image sensor comprises a fourth transistor having: a fourth input coupled to each first output via the reset bus; a fourth output connected to the constant voltage level; and a fourth control configured to receive a global reset signal, wherein applying the discharge signal and the reset signal simultaneously causes the anode of the photodiode of each pixel of the plurality of pixels to be coupled to the constant voltage level, and wherein the discharge signal and the energy harvest signal simultaneously causes the anode of the photodiode of each pixel of the plurality of pixels to be coupled to the energy storage device.

In some embodiments, the plurality of pixels are arranged in a plurality of rows and a plurality of columns, and wherein the second output of each pixel in a first column of pixels is connected to a first pixel output bus and the second output of each pixel in a second column is connected to a second pixel output bus.

In some embodiments, the second control of each pixel in a first row of pixels is configured to receive a first select signal, and wherein the second control of each pixel in a second row of pixels is configured to receive a second select signal.

In some embodiments, the image sensor further comprises a plurality of analog to digital converters, wherein the first pixel output bus is coupled to a first analog to digital converter of the plurality of analog to digital converters and the second pixel output bus is coupled to a second analog to digital converter of the plurality of analog to digital converters.

In accordance with some embodiments of the disclosed subject matter an image sensor is provided, the image sensor comprising: a plurality of pixels, each of the plurality of pixels comprising: a photodiode having an anode and a cathode connected to a constant voltage level; a first transistor having: a first input connected to the anode of the photodiode; a first output connected to a reset bus; and a first control configured to receive a discharge signal; and a comparator having: a second input connected to the anode of the photodiode and the first input of the transistor; a third input configured to receive a threshold voltage; a second output coupled to a pixel output bus; and a second control configured to receive a select signal and control operation of the comparator based on the selection signal; a second transistor having: a fourth input coupled to each first output via the reset bus; a third output configured to be coupled to an energy storage device; and a third control configured to receive an energy harvest signal.

In some embodiments, the second control of each pixel in a first row of pixels receives multiple select signals at various times during a signal exposure time.

In accordance with some embodiments of the disclosed subject matter, a digital camera is provided, the digital camera comprising: an energy storage device; an image sensor, the image sensor comprising: a plurality of pixels, each of the plurality of pixels comprising: a photodiode having an anode and a cathode connected to a constant voltage level; a first transistor having: a first input connected to the anode of the photodiode; a first output connected to a reset bus; and a first control configured to receive a discharge signal; and a second transistor having: a second input connected to the anode of the photodiode; a second output connected to a pixel output bus; and a second control configured to receive a select signal; and a third transistor having: a third input coupled to each first output via the reset bus; a third output coupled to the energy storage device; and a third control configured to receive an energy harvest signal; and a hardware processor that is configured to: apply the discharge signal during a first time period; inhibit the discharge signal and the select signal during a second time period; inhibit the discharge signal during a third time period and apply the select signal during the third time period; and apply the discharge signal and the energy harvest signal during a fourth time period.

In some embodiments, the hardware processor is further configured to control the duration of the fourth time period based on a voltage of the energy storage device.

In some embodiments, the hardware processor is further configured to control the duration of the fourth time period based on a current that flows into the energy storage device at the beginning of the fourth time period.

In some embodiments, the image sensor further comprises a fourth transistor having: a fourth input coupled to each first output via the reset bus; a fourth output connected to the constant voltage level; and a fourth control configured to receive a global reset signal; wherein the hardware processor is further configured to apply the reset signal during the first time period.

In some embodiments, the plurality of pixels are arranged in a plurality of rows and a plurality of columns, and wherein the second output of each pixel in a first column of pixels is connected to a first pixel output bus and the second output of each pixel in a second column is connected to a second pixel output bus.

In some embodiments, the hardware processor is further configured to: apply a first select signal to the first control of each pixel in a first row of pixels, and apply a second select signal to the first control of each pixel in a second row of pixels.

In some embodiments, the digital camera further comprises a plurality of analog to digital converters, wherein the first pixel output bus is coupled to a first analog to digital converter of the plurality of analog to digital converters and the second pixel output bus is coupled to a second analog to digital converter of the plurality of analog to digital converters.

In some embodiments, the energy storage device is a rechargeable battery.

In some embodiments, the photodiode of each pixel is a photovoltaic cell, and wherein the image sensor is a large format image sensor.

In some embodiments, the image sensor is a solid-state image sensor.

In accordance with some embodiments of the disclosed subject matter, an image sensor is provided, the image sensor comprising: a plurality of pixels, each of the plurality of pixels comprising: a means for generating an image signal based on a received amount of light, the means for generating the image signal having an anode and a cathode connected to a constant voltage level; a first means for switching having: a first input connected to the anode of the means for generating the image signal; a first output connected to a reset bus; and a first control means for controlling a state of the first means for switching, the first control means configured to receive a discharge signal; and a second means for switching having: a second input connected to the anode of the photodiode; a second output connected to a pixel output bus; and a second control means for controlling a state of the second means for switching, the second control means configured to receive a select signal; and a third means for switching having: a third input coupled to each first output via the reset bus; a third output configured to be coupled to an energy storage device; and a third control means for controlling a state of the third means for switching, the third control means configured to receive an energy harvest signal.

In some embodiments, the image sensor further comprises a fourth means for switching having: a fourth input coupled to each first output via the reset bus; a fourth output connected to the constant voltage level; and a fourth control means for controlling a state of the fourth means for switching, the fourth control means configured to receive a global reset signal, wherein applying the discharge signal and the reset signal simultaneously causes the anode of the photodiode of each pixel of the plurality of pixels to be coupled to the constant voltage level, and wherein the discharge signal and the energy harvest signal simultaneously causes the anode of the photodiode of each pixel of the plurality of pixels to be coupled to the energy storage device.

In some embodiments, the plurality of pixels are arranged in a plurality of rows and a plurality of columns, and wherein the second output of each pixel in a first column of pixels is connected to a first pixel output bus and the second output of each pixel in a second column is connected to a second pixel output bus.

In some embodiments, the second control means of each pixel in a first row of pixels is configured to receive a first select signal, and wherein the second control means of each pixel in a second row of pixels is configured to receive a second select signal.

In some embodiments, the image sensor further comprises a plurality of analog to digital conversion means for converting an analog signal to a digital signal, wherein the first pixel output bus is coupled to a first analog to digital conversion means of the plurality of analog to digital conversion means and the second pixel output bus is coupled to a second analog to digital conversion means of the plurality of analog to digital conversion means.

In accordance with some embodiments of the disclosed subject matter, an image sensor is provided, the image sensor comprising: a plurality of pixels, each of the plurality of pixels comprising: a means for generating an image signal based on a received amount of light, the means for generating the image signal having an anode and a cathode connected to a constant voltage level; a first means for switching having: a first input connected to the anode of the photodiode; a first output connected to a reset bus; and a first control means for controlling a state of the first means for switching, the first control means configured to receive a discharge signal; and a means for comparing at least two signals having: a second input connected to the anode of the photodiode and the first input of the transistor; a third input configured to receive a threshold voltage; a second output coupled to a pixel output bus; and a second control means for controlling operation of the means for comparing at least two signals, the means for comparing the at least two signals configured to receive a select signal and control operation of the comparator based on the selection signal; a second means for switching having: a fourth input coupled to each first output via the reset bus; a third output configured to be coupled to an energy storage device; and a third means for controlling a state of the second means for switching, the third control means configured to receive an energy harvest signal.

In some embodiments, the second control means of each pixel in a first row of pixels receives multiple select signals at various times during a signal exposure time.

In accordance with some embodiments of the disclosed subject matter, a digital camera is provided, the digital camera comprising: means for storing energy; an image sensor, the image sensor comprising: a plurality of pixels, each of the plurality of pixels comprising: a means for generating an image signal based on a received amount of light, the means for generating the image signal having an anode and a cathode connected to a constant voltage level; a first means for switching having: a first input connected to the anode of the means for generating the image signal; a first output connected to a reset bus; and a first control means for controlling a state of the first means for switching, the first control means configured to receive a discharge signal; and a second means for switching having: a second input connected to the anode of the photodiode; a second output connected to a pixel output bus; and a second control means for controlling a state of the second means for switching, the second control means configured to receive a select signal; and a third means for switching having: a third input coupled to each first output via the reset bus; a third output configured to be coupled to an energy storage device; and a third control means for controlling a state of the third means for switching, the third control means configured to receive an energy harvest signal; and means for processing that is configured to: apply the discharge signal during a first time period; inhibit the discharge signal and the select signal during a second time period; inhibit the discharge signal during a third time period and apply the select signal during the third time period; and apply the discharge signal and the energy harvest signal during a fourth time period.

In some embodiments, the means for processing is further configured to control the duration of the fourth time period based on a voltage of the energy storage device.

In some embodiments, the means for processing is further configured to control the duration of the fourth time period based on a current that flows into the energy storage device at the beginning of the fourth time period.

In some embodiments, the image sensor further comprises a fourth means for switching having: a fourth input coupled to each first output via the reset bus; a fourth output connected to the constant voltage level; and a fourth control means for controlling a state of the fourth means for switching, the fourth control means configured to receive a global reset signal; wherein the means for processing is further configured to apply the reset signal during the first time period.

In some embodiments, the means for processing is further configured to: apply a first select signal to the first control of each pixel in a first row of pixels, and apply a second select signal to the first control of each pixel in a second row of pixels.

In some embodiments, the digital camera further comprises a plurality of analog to digital conversion means for converting an analog signal to a digital signal, wherein the first pixel output bus is coupled to a first analog to digital conversion means of the plurality of analog to digital conversion means and the second pixel output bus is coupled to a second analog to digital conversion means of the plurality of analog to digital conversion means.

In some embodiments, the means for storing energy is a rechargeable battery.

In some embodiments, the means for generating an image signal based on a received amount of light is a photovoltaic cell, and the image sensor is a large format image sensor.

In some embodiments, the image sensor is a solid-state image sensor.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

DETAILED DESCRIPTION

In accordance with various embodiments, mechanisms for self-powered image sensors are provided. In accordance with some embodiments, a pixel configured in accordance with the mechanisms described herein can include two transistors electrically connected to a photodiode in photovoltaic mode. For example, such a two-transistor (2T) pixel can include a first transistor that acts as a switch to control a connection between the anode of the photodiode and an energy harvester, and a second transistor that acts as a switch to control a connection between the anode of the photodiode and read-out circuitry for generating a digital image data. In such an example, the first transistor can be controlled to harvest energy from and/or reset the pixel during times when image data is not being generated, and the second transistor can be controlled to read-out a signal that has been accumulated in the pixel during an integration period during which image data is generated.

In some embodiments, the mechanisms described herein can control the integration period and/or an energy harvest period of an image sensor configured in accordance with the mechanisms described herein based on the current power level of a system including the image sensor, the brightness of a scene and/or any other suitable factor or factors. For example, the mechanisms described herein can control the integration period and/or an energy harvest period based on a voltage of a power source such as a battery, capacitor (e.g., having a capacitance on the order of farads or greater) and/or any other suitable power source, and a set point for the voltage. As another example, the mechanisms described herein can control the integration period and/or an energy harvest period based on the brightness of the scene, as a bright scene can cause the pixels to generate more energy.

Figure 2:
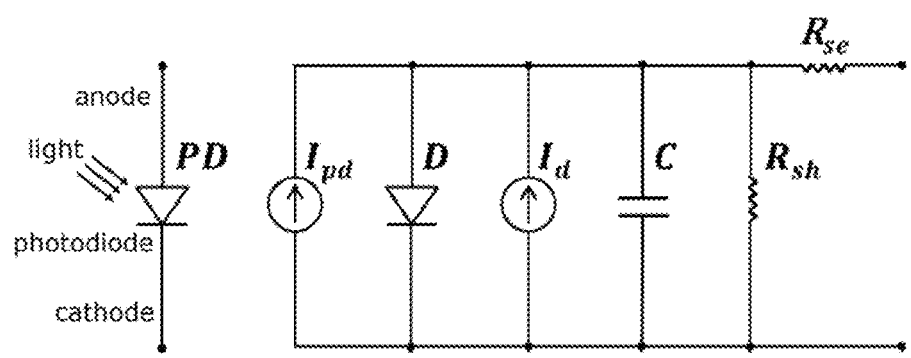
FIG. 2 shows an example of a model of a conventional photodiode.
Figure 3:
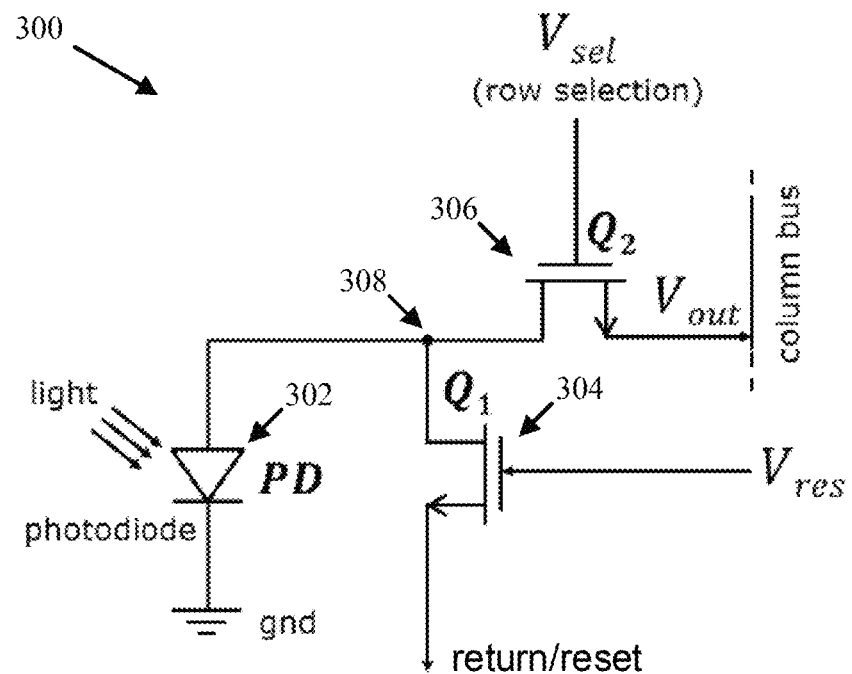
FIG. 3 shows an example of a circuit for implementing a pixel of a self-powered image sensor in accordance with some embodiments of the disclosed subject matter.

Turning to FIG. 3, an example 300 of a circuit for implementing a pixel of a self-powered image sensor is shown in accordance with some embodiments of the disclosed subject matter. As shown in FIG. 3, pixel 300 can include a photodiode 302 (also labeled PD), a pixel-reset transistor 304 (also labeled as transistor Q1) and a read-out transistor 306 (also labeled as transistor Q2). In some embodiments, photodiode 302 can be implemented using any suitable technique or combination of techniques. For example, in some embodiments, photodiode 302 can be implemented using complementary metal-oxide semiconductor (CMOS) techniques to integrate the photodiode into a solid-state image sensor. In a more particular example, as described above in connection with FIG. 2, photodiode 302 can be implemented as a p-n junction. As another example, in some embodiments, photodiode 302 can be implemented as a photovoltaic cell implemented using any suitable technique. In a more particular example, photodiode 302 can be implemented as a photovoltaic cell that is typically used in solar power generation.

In some embodiments, as shown in FIG. 3, photodiode 302 can be operated in photovoltaic mode such that a cathode of photodiode 302 can be connected to a ground voltage, and an anode of photodiode 302 can be connected to an input (e.g., a drain) of both pixel-reset transistor 304 and read-out transistor 306. In operation, when a suitable photon of light is incident on a surface of photodiode 302 in photovoltaic mode, the voltage at a node 308, to which the anode of photodiode 302 is connected, increases. Note that photodiode 302 operating in photovoltaic mode may respond to light more slowly than if photodiode 302 were operating in reverse-biased mode due to the lack of the bias voltage. However, operating photodiode 302 in photovoltaic mode does not require any power to generate a voltage that represents the intensity of light from a scene to be imaged, and also does not generate dark current.

Note that the terms gate, source and drain are generally used herein in describing control, input and output terminals of pixel-reset transistor 304, read-out transistor 306 and any other transistors described herein and that these terms are typically used when describing the field-effect-type of transistor. However, these terms are merely used for convenience of explanation and should not be read as limiting the transistors described herein to any specific type of transistor. For example, the terminals of pixel-reset transistor 304, read-out transistor 306 and any other transistors described herein can alternative be described using terms such as base, collector and emitter (which are typically used when describing bi-polar junction-type transistors) in place of gate, source and drain, respectively. As another example, any other suitable terms for describing the terminals of any suitable type transistor can be used in place of gate, source and drain. Additionally, in some embodiments, one or more of pixel-reset transistor 304, read-out transistor 306 and/or any other transistors described herein that act as a switch can be implemented using any suitable technique or combination of techniques for providing a controllable switch.

Figure 1:
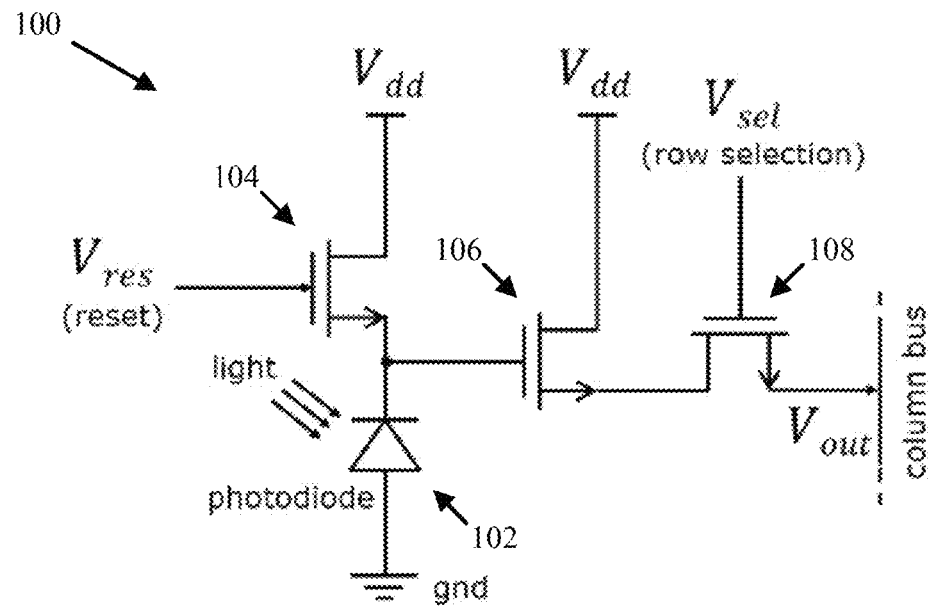
FIG. 1 shows an example of a circuit for a conventional three transistor pixel.

In some embodiments, pixel-reset transistor 304 and/or read-out transistor 306 can be implemented as any suitable type of transistor using any suitable technique or combination of techniques. For example, in some embodiments, pixel-reset transistor 304 and/or read-out transistor 306 can be implemented as field-effect-type (e.g., a FET, a JFET, etc.) transistor, a bipolar junction-type (e.g., a BJT) transistor, and/or any other suitable type of transistor. As shown in FIG. 3, in some embodiments, the anode of photodiode 302 can be connected to a drain of both pixel-reset transistor 304 and read-out transistor 306. In the photovoltaic mode, photodiode 302 is not connected to a bias voltage, but is instead operated with no bias. Further, due to the lack of the bias voltage, photodiode 302 in the photoelectric mode does not generate dark current, as it would if it were in reverse-bias mode (as described above in connection with FIG. 1).

As shown in FIG. 3 and described below in connection with FIG. 5, in some embodiments, an output (e.g., a source) of pixel-reset transistor 304 can be coupled to a return/reset bus which can, in turn, be coupled to a ground voltage and/or an energy harvester. In some embodiments, a control (e.g., a gate) of pixel-reset transistor 304 can be coupled to a pixel-discharge line for applying a reset voltage ($V_{res}$) to the gate such that node 308 can be coupled to ground and/or an energy harvester, as described below in connection with FIG. 5.

As shown in FIG. 3 and described below in connection with FIG. 5, in some embodiments, a source of read-out transistor 306 can be connected to a column bus. As described below in connection with FIG. 5, the column bus can be connected to any suitable circuits for generating image data based on a voltage (e.g., $V_{out}$) read-out from pixel 300. Additionally, in some embodiments, a gate of read-out transistor 306 can be coupled to a row selection line for applying a row-selection voltage ($V_{sel}$) to the gate such that the voltage at node 308 can be read out to the column bus.

Figure 4:
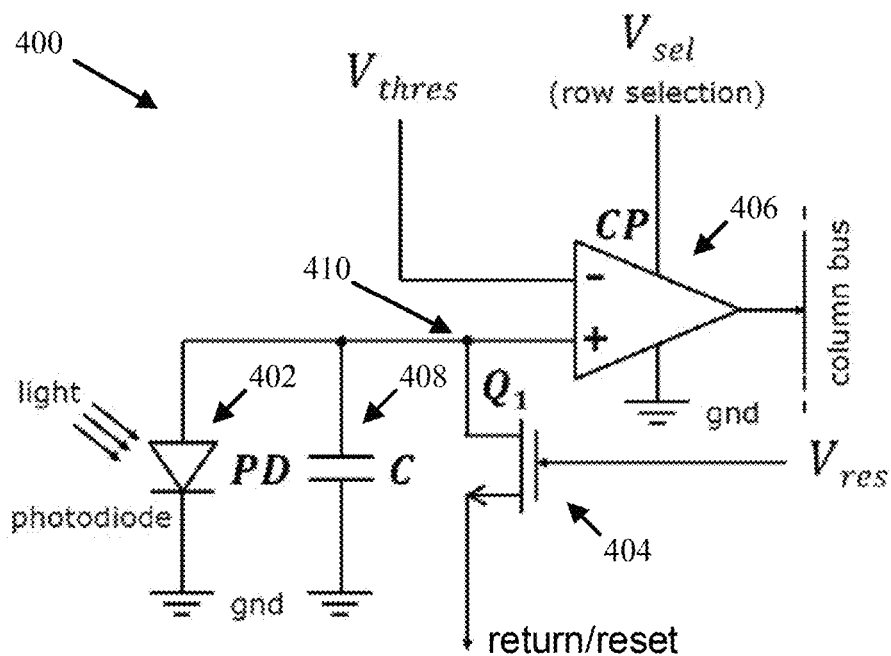
FIG. 4 shows another example of a circuit for implementing a pixel of a self-powered image sensor in accordance with some embodiments of the disclosed subject matter.

FIG. 4 shows another example 400 of a circuit for implementing a pixel of a self-powered image sensor in accordance with some embodiments of the disclosed subject matter. As shown in FIG. 4, pixel 400 can include a photodiode 402 (also labeled PD), a pixel-reset transistor 404 (also labeled as transistor Q1), a comparator 406 (also labeled CP) and a capacitor 408 (also labeled C). In some embodiments, photodiode 402 can be implemented using any suitable technique or combination of techniques, such as techniques described above in connection with photodiode 302. In operation, when a suitable photon of light is incident on a surface of photodiode 402 in photovoltaic mode, the voltage at a node 410 to which the anode of photodiode 402 is connected increases.

In some embodiments, pixel-reset transistor 404 can be implemented as any suitable type of transistor using any suitable technique or combination of techniques, such as techniques described above in connection with pixel-reset transistor 304 and/or read-out transistor 306. As shown in FIG. 4, in some embodiments, the anode of photodiode 402 can be connected to a drain of pixel-reset transistor 404, a first input of comparator 406 and a first terminal of capacitor 408.

In some embodiments, as described above in connection with pixel-reset transistor 304 of FIG. 3, pixel-reset transistor 404 can be can be connected to a return/reset bus which can, in turn, be connected to a ground voltage and/or an energy harvester. In some embodiments, a gate of pixel-reset transistor 404 can be connected to a pixel-discharge line for applying a reset voltage ($V_{res}$) to the gate such that node 410 can be coupled to ground and/or an energy harvester, as described below in connection with FIG. 5.

In some embodiments, as shown in FIG. 4, a second input of comparator 406 can be connected to a threshold voltage ($V_{thres}$) to which the voltage at node 410 is to be compared. The threshold voltage can be any suitable voltage between zero and the maximum voltage that accumulates at node 410. For example, in some embodiments in which photodiode 102 is implemented as a conventional photodiode typically used for imaging, threshold voltage $V_{thres}$ can be on the order of 0.5 Volts, but may be somewhat higher or lower based on the desired properties of the image sensor. In a more particular example, using a higher threshold can increase the sensitivity of pixel 400 when capturing a bright area of a scene as it takes more time for the threshold to be reached. In another more particular example, using a lower threshold can increase the sensitivity of pixel 400 when capturing a dark area of a scene as it takes less time for the threshold to be reached, and more pixels can reach the threshold during the exposure period. As another example, threshold voltage $V_{thres}$ can be higher (e.g., on the order of volts) when photodiode 102 is implemented using a solar cell having multiple p-n junctions. In some embodiments, when the voltage at node 410 becomes greater than the threshold voltage, the output of the comparator can change from low (e.g., zero) to high (e.g., one), or vice versa. In some embodiments, a value for the pixel can be determined based on the amount of time that passed between when the voltage at node 410 was reset and when the output of comparator 406 changes. For example, in some embodiments, the output from comparator 406 can be read out from each pixel multiple times during an exposure, and when the output of comparator 406 changes (e.g., from zero to one), the time when the value was read out can be recorded, and the time when the change was recorded can be used to determine the intensity of light that impinged on that pixel. In a more particular example, if the output from each pixel changes before the end of an exposure time, the exposure can be stopped early as no new information will be generated. As another example, in some embodiments, the output of comparator 406 can be used to control a circuit (not shown) associated with each pixel that can record the value of a digital counter or a ramp voltage when the output of the comparator changes (e.g., from zero to one) during an exposure. In some embodiments, an output of comparator 406 can be connected to a column bus. As described below in connection with FIG. 5, the column bus can be connected to any suitable circuits for generating image data based on a voltage ($V_{out}$) read-out from pixel 400. Additionally, in some embodiments, an output of comparator 406 can be controlled based on a value of a row-selection voltage ($V_{sel}$).

In some embodiments, the second terminal of capacitor 408 can be connected to ground such that the voltage at a node 410 is smoothed. In such embodiments, the presence of capacitor 408 can, for example, increase the amount of time it takes for node 410 to reach a particular voltage based on a given intensity of light impinging on pixel 400. As another example, capacitor 408 can be used in filtering out noise from certain lighting (e.g., 60 Hertz or 120 Hertz oscillations in light intensity due to fluorescent and/or LED lighting sources). As yet another example, capacitor 408 can inhibit discontinuities in the value of the voltage at node 410. Additionally, in some embodiments, a capacitance of capacitor 410 can control how quickly the voltage at node 410 can change, and thus can control the speed of integration. For example, a relatively lower capacitance can allow the voltage at node 410 to change more quickly, thus potentially facilitating shorter exposure times. As another example, a relatively higher capacitance can reduce the speed at which the voltage at node 410 changes, thus potentially facilitating a wider dynamic range. In some embodiments, capacitor 408 can have a capacitance on the order of picofarads to tens of picofarads.

As shown in FIG. 4, in some embodiments, an output of comparator 406 can be connected to a column bus. As described below in connection with FIG. 5, the column bus can be connected to any suitable circuits for generating image data based on a voltage ($V_{out}$) read-out from pixel 400.

Figure 5:
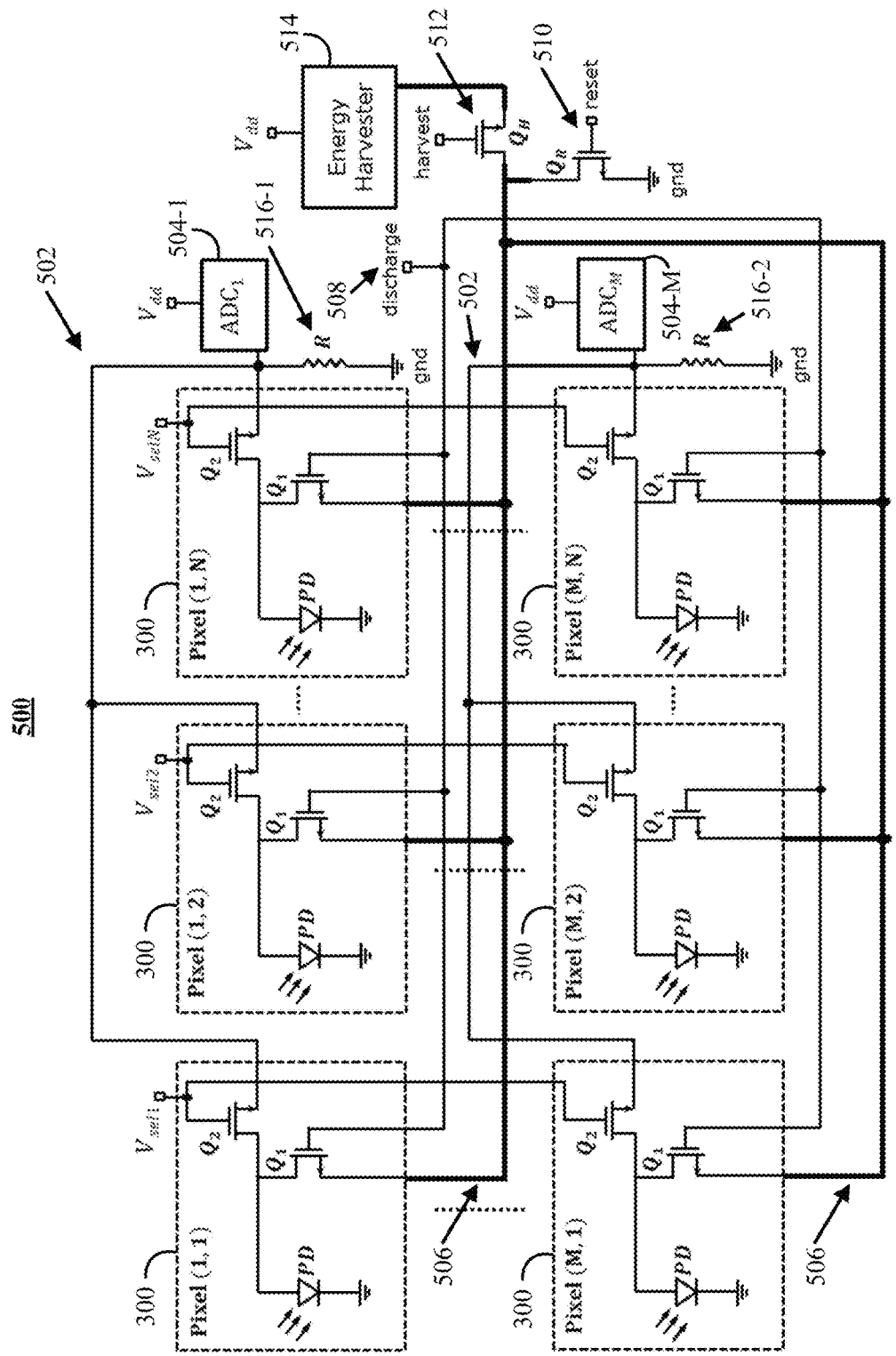
FIG. 5 shows an example circuit for a self-powered image sensor in accordance with some embodiments of the disclosed subject matter.

FIG. 5 shows an example 500 of a self-powered image sensor in accordance with some embodiments of the disclosed subject matter. As shown in FIG. 5, image sensor 500 can include any suitable number of pixels 300, described above in connection with FIG. 3. In some embodiments, image sensor 500 can be a solid-state image sensor (e.g., an image sensor fabricated using CMOS techniques), an array of individual (or groups of) photovoltaic cells, and/or any other suitable arrangement of parts. Additionally, in some embodiments, image sensor 500 can include any suitable number of pixels. As shown in FIG. 5, each pixel 300 is labeled with coordinates (X, Y), where X denotes a column address of the pixel and Y denotes a row address of the pixel.

In some embodiments, image sensor 500 can include one or more column buses 502. As described above in connection with FIG. 3, a source of read-out transistor 306 of each pixel 300 can be connected to a column bus (e.g., column bus 502). In some embodiments, when a particular row selection signal is applied (e.g., $V_{sel1}$, $V_{sel2}$, $V_{selN}$, etc.), the voltage accumulated at each pixel 300 in that row can be read out to a respective column bus. In a more particular example, when row selection voltage, $V_{sel1}$, is applied to pixels (1,1) through (M,1), the voltages accumulated at these pixels are read out to corresponding column buses 502. Note that the voltage on column bus 502 substantially corresponds to the voltage accumulated at pixel 300 that was selected via a row selection signal but may be slightly different due to, for example, parasitic losses introduced by read-out transistor 306.

In some embodiments, each column bus 502 can be connected to an analog-to-digital converter (ADC) 504. ADC 504 can be implemented using any suitable technique or combination of techniques. In some embodiments, an output of ADC 504 can be coupled to an image processing circuit or any other suitable hardware (such as a microprocessor) that can receive the digital signals output by the ADC and construct an image based on the signals. In some embodiments, ADC 504 can receive a voltage $V_{dd}$ that can be used for operating ADC 504.

In some embodiments, image sensor 500 can include a return/reset bus 506 coupled to each pixel 300. As described above in connection with FIG. 3, a source of pixel-reset transistor 304 of each pixel can be connected to a return/reset bus (e.g., return/reset bus 506). In some embodiments, when a discharge signal is applied to the gate of pixel-reset transistors 304 of pixels 300, the voltage accumulated at each pixel 300 in image sensor 500 can be discharged onto return/reset bus 506. For example, prior to an integration period for capturing an image using image sensor 500, the discharge voltage can be applied and the voltage accumulated at each pixel can be discharged through the respective pixel-reset transistor 304 to return/reset bus 506. In some embodiments, the discharge signal can be supplied via a discharge terminal 508 and the pixel-discharge line.

In some embodiments, return/reset bus 506 can be connected to a drain of a global reset transistor 510 (also labeled $Q_R$) and a drain of a harvest transistor 512 (also labeled $Q_H$). In some embodiments, a gate of global reset transistor 510 can receive a global reset signal via a reset terminal to cause return/reset bus 506 to be coupled to ground, discharging any voltage that has accumulated in pixels 300 and/or on return/reset bus 506.

In some embodiments, a gate of harvest transistor 512 can receive a harvest signal via a harvest terminal to cause return/reset bus 506 to be coupled to an energy harvester 514, harvesting any voltage that has accumulated in pixels 300 and/or on return/reset bus 506 for use in powering and/or controlling image sensor 500. In some embodiments, energy harvester 514 can include any suitable circuits and/or other hardware for storing energy captured by pixels 300. For example, in some embodiments, energy harvester 514 can include a rechargeable battery, and/or any other suitable circuitry and components associated with the rechargeable battery (e.g., power electronics), that can be recharged using energy captured by pixels 300. As another example, in some embodiments, energy harvester 514 can include a supercapacitor, and/or any other suitable circuitry and components associated with the super capacitor (e.g., power electronics), that can be charged using energy captured by pixels 300. In some embodiments, a resistor 516 (also labeled R in FIG. 5) can be connected to column bus 502. In some embodiments, resistor 516 can have any suitable resistance. For example, the resistance of resistor 516 can be in the range of 200 ohms ($\Omega$) to 1 kilohm (k$\Omega$). In some embodiments, resistor 516 can provide a controlled load for photodiode 102 during readout. Additionally, in some embodiments, resistor 516 can reduce sensitivity to light during a readout phase, which can reduce noise caused by light incident on the image sensor during readout.

Figure 6:
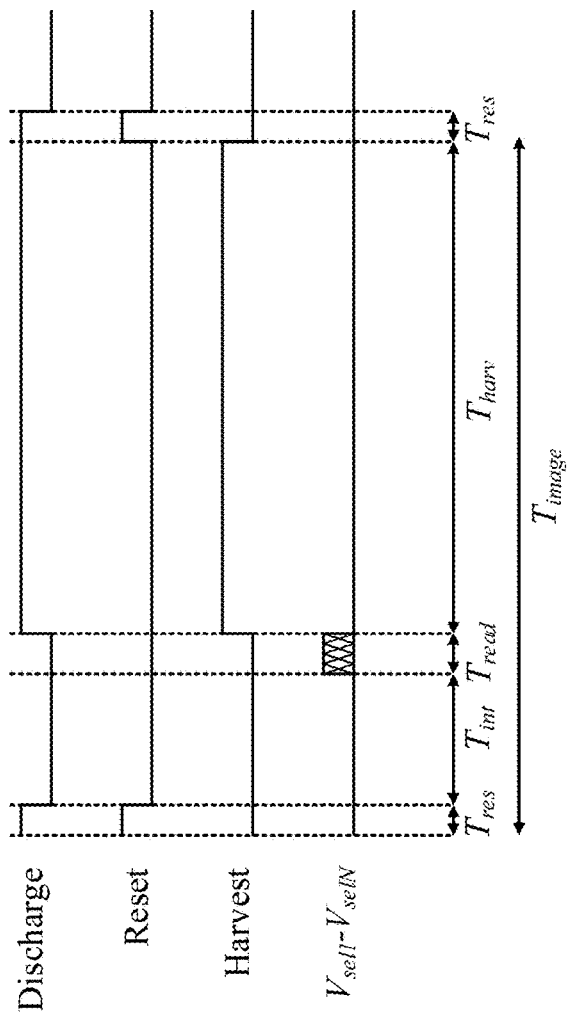
FIG. 6 shows an example of a diagram illustrating timing of signals that can be used to control the image sensor shown in FIG. 5 during an image capture operation in accordance with some embodiments of the disclosed subject matter.

FIG. 6 shows an example 600 of a diagram illustrating the timing of signals that can be used to control the image sensor shown in FIG. 5 during an image capture operation in accordance with some embodiments of the disclosed subject matter. In some embodiments, a microcontroller (or other suitable control circuitry, such as a microprocessor) can supply signals for controlling operation of image sensor 500. For example, the microcontroller can control operation of ADCs 504, and can supply signals $V_{sel1}$ though $V_{selN}$, the discharge signal, the harvest signal and the reset signal, shown in FIG. 5.

In some embodiments, as shown in FIG. 6, the microcontroller can apply the discharge signal to discharge terminal 508 and the reset signal to the gate of global reset transistor 510 for a duration $T_{res}$, which can cause the voltage at all pixels 300 to be reset to a ground voltage by electrically connecting node 310 of each pixel 300 to the ground voltage.

In some embodiments, the microcontroller can inhibit the discharge signal and/or the reset signal after the duration $T_{res}$ has elapsed, and can allow pixels 300 to accumulate charge in response to light incident on photodetector 302 of each pixel for a duration $T_{int}$ (i.e., an integration time).

In some embodiments, the microcontroller can read out voltages from pixels 300 by applying $V_{sel1}$ through $V_{selN}$ to each row of image sensor 500 during a time period $T_{read}$ after the signals have been allowed to accumulate charge for the integration time $T_{int}$. As described above, in connection with FIG. 5, each column can be associated with an ADC 504, which can convert the voltage read out from a pixel in that column to a digital signal when a row selection signal is applied. For example, when $V_{sel1}$ is applied, the voltage of pixel (1,1) of FIG. 5 can be converted to a digital signal by a first ADC 504-1, the voltage of pixel (M,1) can be converted to a digital signal by an M-th ADC 504-M (where M represents the number of columns in image sensor 500), and so on. Note that as used herein the crosshatched portion of signal $V_{sel1}$-$V_{selN}$ represents individually applying each signal in turn.

In some embodiments, the microcontroller can apply the discharge signal to discharge terminal 508 and the harvest signal to the gate of harvest transistor 512 for a duration $T_{harv}$ after reading out the pixels values during time $T_{read}$. In some embodiments, applying the discharge signal and the harvest signal can cause voltage accumulated by pixels 300 to be applied to energy harvester 514, thereby causing current to flow from pixels 300 to energy harvester 514. Note that, as the voltage accumulated by pixels 300 during the integration time $T_{int}$ is read by ADC 504, the voltage is not discharged during read out by the analog to digital converter, but is instead read out non-destructively. Accordingly, the energy that is transferred from the pixels during the time period $T_{harv}$ can include a portion of the energy accumulated by pixels 300 during the integration time period $T_{int}$ and the read out time period $T_{read}$. In some embodiments, the reset signal and the harvest signal can be applied such that the time periods $T_{res}$ and $T_{harv}$ do not overlap.

In some embodiments, the total time, $T_{image}$, to capture an image using image sensor 500 can be represented as:

$$T_{image} = T_{res} + T_{int} + T_{read} + T_{harv}, \qquad (1).$$

In some embodiments, the frame rate, R, at which a camera including image sensor 500 captures images can be characterized $1/T_{image}$. That is, as the total time to capture an image increases, the maximum frame rate decreases. In some embodiments, the framerate of the camera can be controlled (e.g., by the microcontroller described above, a microprocessor, software, etc.) based on the amount of light in a scene captured by a camera including image sensor 500 and/or the voltage of a power supply being used to operate image sensor 500.

Note that, although image sensor 500 and timing diagram 600 are described in connection with pixels 300, note that pixels 400 described above in connection with FIG. 4 can be used in place of pixels 300 with any suitable changes made to the components and/or circuits used to read out image data. For example, rather than an ADC being provided for each column, the time at which the output of comparator 406 changes can be recorded (e.g., based on a counter, a ramp voltage, a digital clock signal, etc.).

Note that, transistors such as reset transistors 304 and 404, pixel read-out transistor 306, global reset transistor 510 and harvest transistor 512 are generally treated as switches such that applying a signal causes the switch to close, creating an electrical connection between the source and drain of the transistor. However, this is merely an example, and one or more of the transistors can be configured such that applying a signal causes the switch to open. For example, the transistors of pixel 300 can be nMOS transistors (in which applying a "high" signal to the gate causes the channel to open) and/or pMOS transistors (in which applying a "high" signal to the gate causes the channel to close). In a more particular example, pixel read-out transistor 306 can be configured such that applying a "high" signal causes node 308 to be electrically connected to column bus 502, and reset transistor 304 can be configured such that applying a "high" signal causes node 308 to be electrically disconnected from return/reset bus 506. Further note that although transistors are generally given as examples in describing pixels 300 and 400 and image sensor 500, any suitable circuit or combination of circuits for providing a switch can be used in place of one or more of the transistors described herein.

In some embodiments, a camera including image sensor 500 can have an imaging mode and a non-imaging mode. In such embodiments, during the imaging mode, image sensor 500 can be controlled as described above in connection with FIG. 6, and in a non-imaging mode, image sensor 500 can be controlled to continuously harvest energy. For example, a camera including image sensor 500 can receive an indication that the camera is to capture one or more images (e.g., based on a user input, based on a sensor output such as a motion detector, etc.) when the camera is in a non-imaging mode, and in response to the indication, camera 500 can enter an imaging mode and control image sensor 500 as described in connection with FIG. 6.

Figure 7:
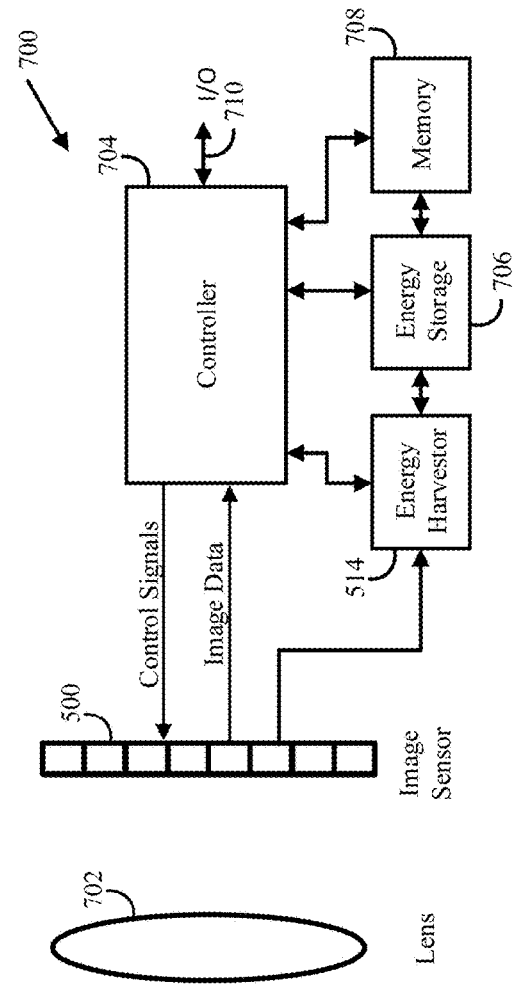
FIG. 7 shows an example of a block diagram a camera including the self-powered image sensor of FIG. 5 in accordance with some embodiments of the disclosed subject matter.

Turning to FIG. 7, an example 700 of a camera including image sensor 500 is shown in accordance with some embodiments of the disclosed subject matter. As shown in FIG. 7, in some embodiments, camera 700 can include a lens 702 for focusing an image on image sensor 500. Note that lens 702 is shown as a single lens in FIG. 7 for convenience and any suitable number of lenses and/or other optical elements can be used to focus a scene onto image sensor 500. In some embodiments, camera 700 can include a controller 704 for controlling operations of camera 700. Controller 704 can be any suitable general-purpose device such as a computer or special purpose device such as a client, a server, a GPU, etc., and this general or special purpose device can be implemented as a hardware processor (which can be a microprocessor, a digital signal processor, a microcontroller, etc.).

In some embodiments, camera 700 can include an energy storage device 706, such as a rechargeable battery and/or other suitable energy storage device. Note that, in some embodiments, energy storage device 706 can be additional energy storage to an energy storage device included in energy harvester 514 which can be used to power operation of image sensor 500. In some embodiments, energy storage 706 can be omitted.

In some embodiments, camera 700 can include memory 708 for storing images and/or video captured using image sensor 500. In some embodiments, memory 708 can include a storage device (e.g., a hard disk, a Blu-ray disc, a Digital Video Disk, RAM, ROM, EEPROM, etc.) for storing a computer program for controlling operation of controller 704. For example, memory 708 can store a computer program for instructing controller 704 to capture one or more images in accordance with the disclosed subject matter (e.g., by transmitting appropriate control signals to image sensor 500), as well as any other suitable functions of camera 700.

In some embodiments, camera 700 can include an I/O port 710 for allowing communication between controller 704 and other devices, such as a smartphone, a tablet computer, a laptop computer, a personal computer, a server, etc., via a communication link.

In some embodiments, controller 704 can cause images to be captured by image sensor 500 by applying control signals (e.g., a discharge signal, a reset signal, a harvest signal, row selection signals, etc.) to image sensor 500 and/or particular terminals of image sensor 500. Controller 704 can cause images with any suitable integration time (sometimes referred to herein as exposure time) to be captured by sensor 500. Any suitable technique or techniques can be used to control image capture by image sensor 500. Additionally, controller 704 can receive image data output by image sensor 500 in response to instructions to capture images (e.g., control signals). Controller 704 can, in some embodiments, perform any suitable image processing on image data received from image sensor 500.

Although controller 704 is shown as receiving image data from image sensor 500, the image data can be processed by any other suitable processing device or devices. For example, camera 700 can include one or more dedicated processors for performing specific image processing and/or for performing any other suitable actions. In some embodiments, controller 704 and/or any other suitable processing device or devices can perform any suitable processing to create processed image data from the image data received from image sensor 500. For example, photodiodes (e.g., photodiode 102, photodiode 302 and photodiode 402) often have a non-linear response to light such that the same increase in the intensity of light causes a different increase in voltage given different starting intensities. In such an example, controller 704 and/or any other suitable processing device or devices can convert image data output by image sensor 500 to a linear representation of light intensity based on the properties of the photodiode. As another example, different photodiodes and/or pixels can have different response curves to light, which can be intentional (e.g., based on different components being used) and/or unintentional (e.g., based on variation during manufacturing of the photodiodes). In such an example, camera 700 can be calibrated to adjust for these different response curves. In a more particular example, image sensor 500 can be used to capture one or multiple images of a known sample object (e.g., a white piece of paper, a test pattern, etc.) in known conditions (e.g., known light intensity, uniform light intensity, etc.), and the resulting image data can be used to create calibration data. In some embodiments, when camera 700 captures an image, controller 700 and/or any other suitable processing device or devices can use the calibration data to generate calibrated image data based on the image data received from image sensor 500. Additionally, in some embodiments, this calibration data can be used to both account for the non-linear response of the photodiodes and to account for differences between the response curves of individual photodiodes.

Additionally, although controller 704 is shown as supplying control signals to image sensor 500, such signals can be provided by a separate microcontroller (e.g., as described above in connection with FIG. 5), which may be in communication with controller 704, which may, for example, request that one or more images be captured.

In some embodiments, camera 700 can communicate with a remote device over a network using I/O port 710 and a communication link. Additionally or alternatively, camera 700 can be included as part of another device, such as a smartphone, a tablet computer, a laptop computer, a webcam, etc. Parts of camera 700 can be shared with a device with which camera 700 is integrated. For example, if camera 700 is integrated with a smartphone, controller 704 can be a processor of the smartphone and can be used to control operation of camera 700.

Camera 700 can be integrated with and/or communicate with any other suitable device, where the other device can be one of a general-purpose device such as a computer or a special purpose device such as a client, a server, etc. Any of these general or special purpose devices can include any suitable components such as a hardware processor (which can be a microprocessor, digital signal processor, a controller, etc.), memory, communication interfaces, display controllers, input devices, etc. For example, the other device can be implemented as a digital camera, a smartphone, a tablet computer, a personal data assistant (PDA), a personal computer, a laptop computer, a multimedia terminal, a special purpose device, a game console, etc.

Communications over I/O port 710 via a communication link can be carried out using any suitable computer network, or any suitable combination of networks, including the Internet, an intranet, a wide-area network (WAN), a local-area network (LAN), a wireless network, a digital subscriber line (DSL) network, a frame relay network, an asynchronous transfer mode (ATM) network, a virtual private network (VPN). The communications link can include any communication links suitable for communicating data between camera 700 and another device, such as a network link, a dial-up link, a wireless link, a hard-wired link, any other suitable communication link, or any suitable combination of such links. Camera 700 and/or another device (e.g., a server, a personal computer, a smartphone, etc.) can enable a user to execute a computer program that allows the features of the mechanisms described herein to be used.

It should also be noted that data received through the communication link or any other communication link(s) can be received from any suitable source. In some embodiments, controller 704 can send and/or receive data through the communication link or any other communication link(s) using, for example, a transmitter, receiver, transmitter/receiver, transceiver, or any other suitable communication device.

In some embodiments, controller 704 (and/or any other suitable hardware and/or software) can adjust $T_{harv}$ and/or frame rate R during imaging to adjust the amount of energy harvested by the system. For example, controller 704 can control the duration of $T_{harv}$ and/or $T_{int}$ such that the system harvests at least as much energy as is used to operate image sensor 500 (and/or any other suitable components). As another example, under certain lighting conditions (e.g., in situations in which the amount of light in a scene is below a threshold), controller 704 can control the duration of $T_{harv}$ and/or $T_{int}$ such that the system operates at a minimum permitted frame rate.

In some embodiments, controller 704 can adjust $T_{harv}$ as a function of the difference, $V_{diff}$, between a predetermined setpoint, $V_d$, of a power supply that is charged using captured energy and the voltage, $V(t)$, of the power supply. Additionally or alternatively, controller 704 can adjust $T_{harv}$ based on the brightness of the scene being imaged. For example, controller 704 can control $T_{harv}$ as a function of the difference, $I_{diff}$, between a predetermined setpoint current, $I_d$, that represents the current used by the image sensor (e.g., image sensor 500) during a readout cycle and a current, $I(t)$, that flows into the supply at the beginning of the harvesting period $T_{harv}$.

In a more particular example, To can represent the harvesting time needed for the sensor to be fully self-powered for a scene of normal brightness. In such an example, the actual harvesting time $T_{harv}$ can be using the relationship:

$$T_{harv}(t)=T_o+\alpha V_{diff}(t)+\beta I_{diff}(t), \qquad (2),$$

where $\alpha$ and $\beta$ are preset weights related to the voltage and current differences, respectively. In some embodiments, if controller 704 adjusts $T_{harv}$ using equation (2), this can effectively act as a proportional (or P) controller. Alternatively, $T_{harv}$ can be controlled using a proportional-integral-derivative (PID) controller that can also use the time derivatives and integrals of $V_{diff}(t)$ and $I_{diff}(t)$.

In some embodiments, for example as described above in connection with FIG. 3, photodiode 306 can be implemented using photovoltaic cells to create a camera with an image sensor with a relatively large size. In many cases, such that optics that are typically used with digital cameras such as digital single-lens reflex (SLR) cameras, digital point-and-shoot cameras, digital cameras in mobile devices (e.g., a smartphone, a tablet computer, a wearable computer, or any other suitable mobile device), etc., may not be well suited to form a representation of a scene on pixels of the image sensor. For example, an image sensor implemented using photovoltaic cells can form a large format image sensor (e.g., where the size of the sensor is at least four by five inches).

In some embodiments, any suitable optics can be used to form a representation of the scene on the pixels of the image sensor. For example, in situations in which the distance between adjacent pixels (the pixel pitch) is relatively small, each pixel sensor can be associated with an individual lens to focus a portion of the scene onto the pixel. In some embodiments, each pixel can be associated with an elongate tube (sometimes referred to herein as a "straw") that can limit the field of view for the pixel associated with the straw. In some embodiments, a large lens (such as a Fresnel lens) can be used to form a representation of the scene across the image sensor.

Figure 8:
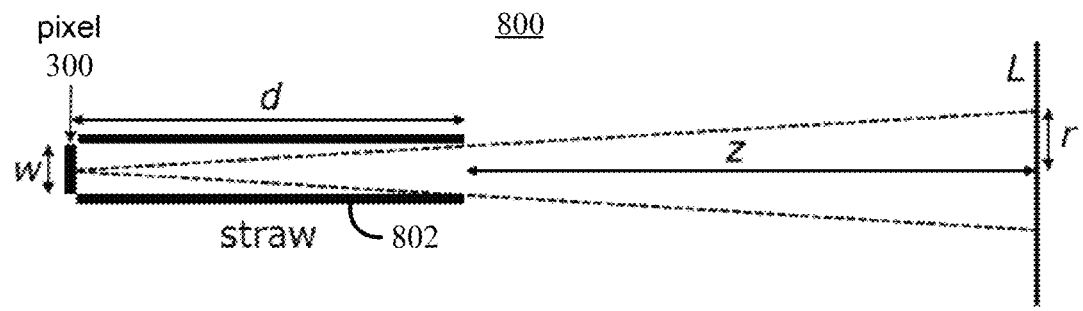
FIG. 8 shows an example of geometries of a pixel adjacent to a straw that limits the field of view of the pixel in accordance with some embodiments of the disclosed subject matter.

FIG. 8 shows an example 800 of a pixel associated with a straw that limits the field of view of the pixel in accordance with some embodiments of the disclosed subject matter. As shown in FIG. 8, a straw 802 extends a length d from pixel 300 and has a width w. In some embodiments, the point spread function (PSF) of the system including straw 802 increases linearly as the distance z between the end of the straw farthest from pixel 300 and an object plain increases.

The irradiance E at a point that is at a distance u from a fronto-planar Lambertian disc with radius r and radiance L can be described, when u>>r, such that $E=L\pi r^2/u^2$. As shown in FIG. 8, the center of pixel 300 is at distance u=d+z from the object plane and receives light from a disc on the plane with a radius r=w(d+z)/2d. If it is assumed that the plane is Lambertain with a radian L, the irradiance E at the center of pixel 300 can be described as:

$$E = L\pi \frac{w^2}{4d^2}. \qquad (3)$$

As shown in equation (3) above, irradiance E is independent of the distance z of the plane from the straw, because while the distance z from the plane to the straw grows larger, the solid angle subtended by the straw from each point on the plane gets smaller and the size of the disc on the plane that the straw receives light from gets larger.

The total flux, $\phi_p$, received by the pixel can be described as:

$$\phi_p = E\pi \frac{w^2}{4} = L\pi^2 \frac{w^4}{16d^2}. \qquad (4)$$

As shown in equation (4) above, if the length d of the straw is held constant, the light efficiency of the straw drops as the second power of the pixel width. Accordingly, using a straw to limit the field of view of pixel 300 can be useful for relatively larger widths w of pixel 300.

Figure 9:
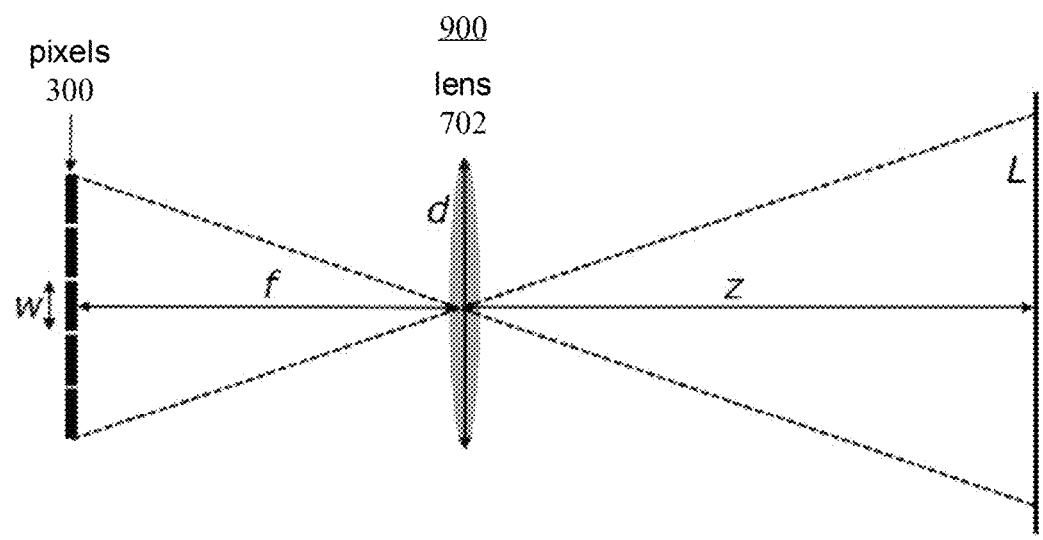
FIG. 9 shows an example of geometries of several pixels associated with a lens that forms a representation of a scene on the several pixels in accordance with some embodiments of the disclosed subject matter.

FIG. 9 shows an example 900 of several pixels associated with a lens that forms a representation of a scene on the several pixels in accordance with some embodiments of the disclosed subject matter. In general, a lens can produce a brighter image on pixel 300 than straw 802, which can result in a higher rate of energy harvesting. As described above in connection with FIG. 5, this can allow for the frame rate R of a camera using a lens to be higher than in a similar camera using straws 802. As shown in FIG. 9, lens 702 having a diameter d and an effective focal length f, the image irradiance E can be related to object radiance L as:

$$E = L\frac{\pi}{4}\left(\frac{d}{f}\right)^2 \cos^4\alpha, \qquad (5)$$

where α is the view angle with respect to the optical axis of lens 702. A ratio N=f/d can be characterized as the effective F-number of the imaging system, and irradiance E is inversely proportional to $N^2$. Note that lens 702 can include several optical components (e.g., lens 702 can be a combination of two or more lenses), and the focal length f in such a case is the effective focal length of the system of optical components.

In some embodiments, the amount of energy that can be harvested by a particular camera system can be related to the aperture of the camera. For example, the light efficiency of a large format camera with a lens as shown in FIG. 9 can be compared to a compact system using a solid-state image sensor given effective F-numbers of the two systems are $N_1$ and $N_2$, respectively. In such an example, the ratio of the image irradiances in the compact and large systems for any given scene irradiance can be described as:

$$\frac{E_2}{E_1} = \frac{N_1^2}{N_2^2}. \qquad (6)$$

For a fixed field of view the ratio of the areas of the solid-state image sensor and large format image sensor is $A_2/A_1 = f_2^2/f_1^2$, and the ratios of the total flux received by the two sensors can be described as:

$$\frac{\phi_2}{\phi_1} = \frac{N_1^2}{N_2^2} \frac{f_2^2}{f_1^2} = \frac{d_2^2}{d_1^2}. \qquad (7)$$

As shown in equation (7) above, the ratio of the energies harvested by the two systems is the ratio of the areas of their apertures. Accordingly, as the compact system using the solid-state sensor typically has a smaller aperture, it is expected to generate less power. However, a solid-state image sensor implemented in accordance with the techniques described herein typically also consumes less power during operation, and thus at least partially offsets any drop in harvested energy.

Figure 10A:
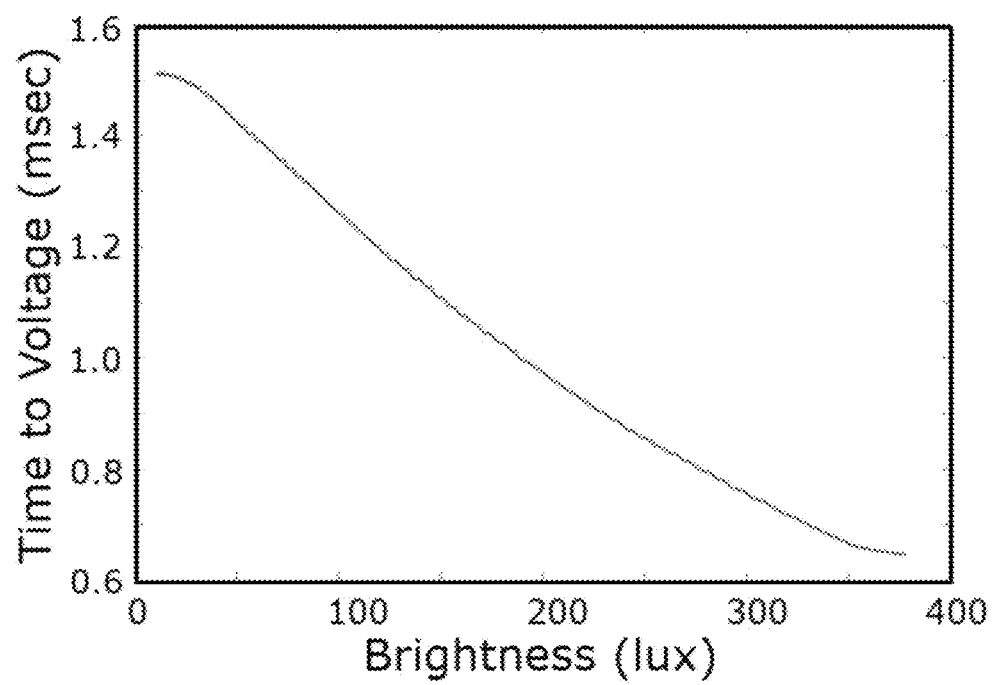
FIGS. 10A and 10B show a radiometric response curve and a point-spread function, respectively, of a pixel of a self-powered image sensor in a particular embodiment of the disclosed subject matter.

FIG. 10A shows a radiometric response curve of a pixel in a particular embodiment of the disclosed subject matter. In the particular embodiment, a large format image sensor can be implemented by pixels 300 including photodiodes 302 being implemented with BPW34 photodiodes available from Vishay Semiconductors, having an active area of 2.8 millimeters by 2.8 millimeters. In such an embodiment, one or more straws having a 4 millimeter by 4 millimeter cross section and a length d of 250 millimeters can be used to restrict the field of view observed by each pixel 300. In such an embodiment, the large format image sensor can be controlled using a microcontroller (e.g., in accordance with the timing described above in connection with FIG. 6), such as a MC13226V microcontroller available from Freescale Semiconductor. In such an embodiment, the time to take a single pixel measurement can be on the order of 100 milliseconds. The radiometric response shown in FIG. 10A was measured by placing the pixel including the BPW34 photodiode associated with the 4 mm×4 mm×250 mm straw so as to capture light from a display having a brightness that was increased from 0 to 255 in increments of one, and recording the time-to-voltage at each brightness.

Figure 10B:
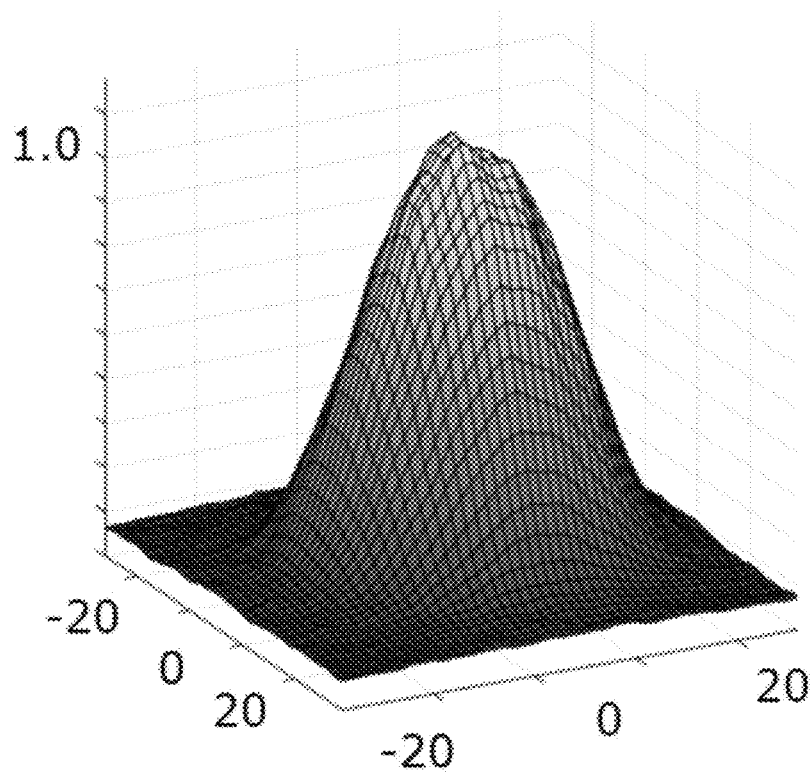

FIG. 10B shows the PSF of the pixel in the particular embodiment of the disclosed subject matter. The PSF of the pixel was measured by placing the pixel including the BPW34 photodiode associated with the 4 mm×4 mm×250 mm straw so as to capture light from a display and raster scanning a small white spot across the display. The pixel measurement at each spot was recorded, and the measurements were linearized using the radiometric response curve of FIG. 10A.

Figure 11:
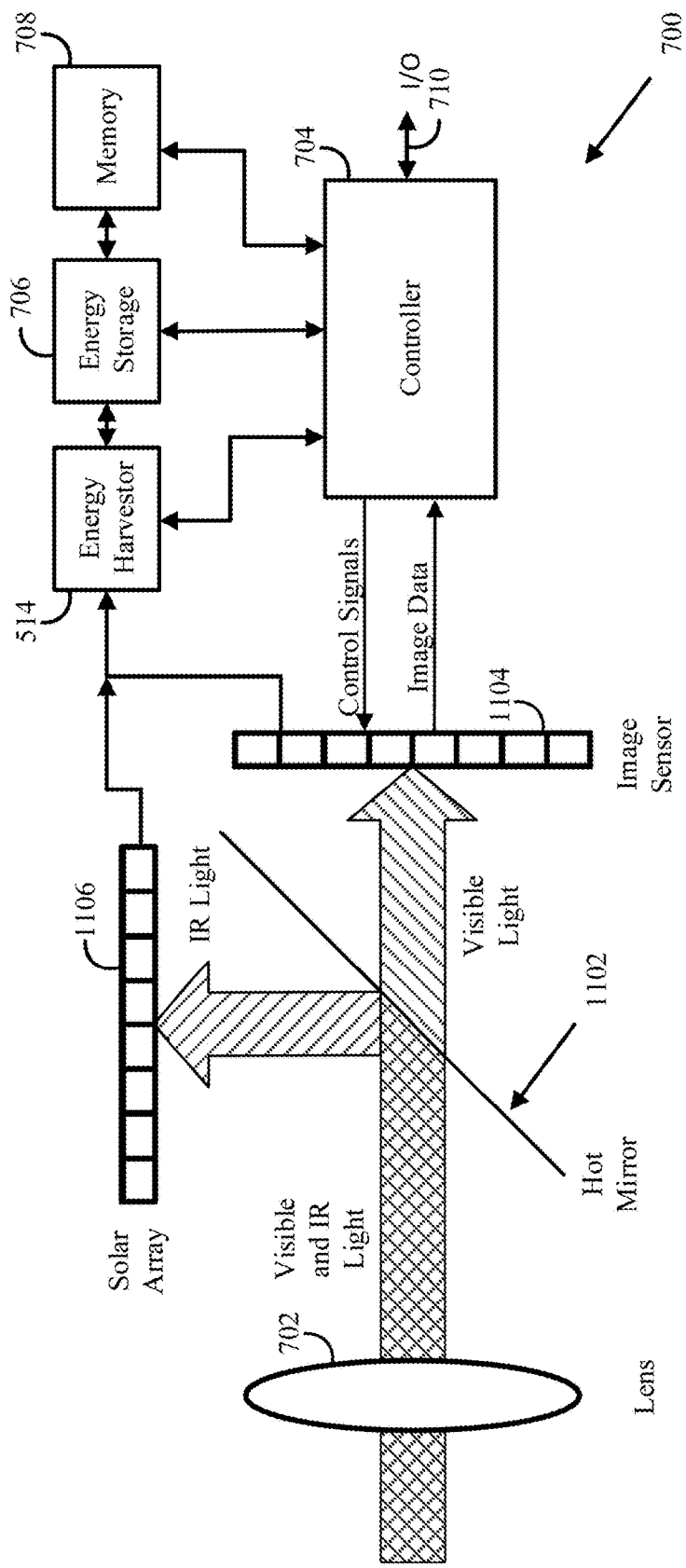
FIG. 11 shows an example of a block diagram of a camera including an image sensor and a solar array in accordance with some embodiments of the disclosed subject matter.

FIG. 11 shows an example 1100 of a camera including an image sensor and a solar array in accordance with some embodiments of the disclosed subject matter. As shown in FIG. 11, camera 1100 can include similar components to camera 700, such as energy harvester 514, lens 702, controller 704, energy storage 706, memory 708, and I/O port 710. Additionally, in some embodiments, camera 1100 can include a hot mirror 1102, which can reflect infrared light, and pass visible light. In some embodiments, hot mirror 1102 can be implemented using any suitable technique of combination of techniques.

In some embodiments, an image sensor 1104 can receive visible light passed by hot mirror 1102. Image sensor 1104 can be any suitable image sensor that can generate image data based on received visible light. For example, image sensor 1104 can be an image sensor that uses conventional pixels, such as pixel 100 described above in connection with FIG. 1. As another example, image sensor 1104 can be implemented using pixels 300 as described above in connection with image sensor 500 of FIG. 5.

In some embodiments, a solar array 1106 can receive infrared light reflected by hot mirror 1102. Solar array 1106 can include one or more photovoltaic cells that can generate current in response to receiving infrared light. Additionally, in some embodiments, solar array 1106 can be configured to be more sensitive to infrared light than visible light.

In some embodiments, energy generated by solar array 1106 and image sensor 1104 (if image sensor 1104 is implemented with pixels 300, for example) can be received by energy harvester 514 and can be used to power operations of image sensor 1106 and/or any other suitable operations of camera 1100.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

The provision of the examples described herein (as well as clauses phrased as "such as," "e.g.," "including," and the like) should not be interpreted as limiting the claimed subject matter to the specific examples; rather, the examples are intended to illustrate only some of many possible aspects. It should also be noted that, as used herein, the term mechanism can encompass hardware, software, firmware, or any suitable combination thereof.

It should be noted that, as used herein, the term mechanism can encompass methods, systems, media, and any other hardware, software and firmware, or any suitable combination thereof.

Accordingly, circuits for self-powered image sensors are provided.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed:

1. An image sensor, the image sensor comprising:
  a plurality of pixels, each of the plurality of pixels comprising:
    a photodiode having an anode and a cathode connected to a constant voltage level;
    a first transistor having:
      a first input connected to the anode of the photodiode;
      a first output connected to a reset bus; and
      a first control configured to receive a discharge signal; and
    a second transistor having:
      a second input connected to the anode of the photodiode;
      a second output connected to a pixel output bus; and
      a second control configured to receive a select signal; and
  a third transistor having:
    a third input coupled to each first output via the reset bus;
    a third output configured to be coupled to an energy storage device; and
    a third control configured to receive an energy harvest signal.

2. The image sensor of claim 1, further comprising a fourth transistor having:
  a fourth input coupled to each first output via the reset bus;
  a fourth output connected to the constant voltage level; and
  a fourth control configured to receive a global reset signal, wherein applying the discharge signal and the reset signal simultaneously causes the anode of the photodiode of each pixel of the plurality of pixels to be coupled to the constant voltage level, and wherein the discharge signal and the energy harvest signal simultaneously causes the anode of the photodiode of each pixel of the plurality of pixels to be coupled to the energy storage device.

3. The image sensor of claim 1, wherein the plurality of pixels are arranged in a plurality of rows and a plurality of columns, and wherein the second output of each pixel in a first column of pixels is connected to a first pixel output bus and the second output of each pixel in a second column is connected to a second pixel output bus.

4. The image sensor of claim 3, wherein the second control of each pixel in a first row of pixels is configured to receive a first select signal, and wherein the second control of each pixel in a second row of pixels is configured to receive a second select signal.

5. The image sensor of claim 3, further comprising a plurality of analog to digital converters, wherein the first pixel output bus is coupled to a first analog to digital converter of the plurality of analog to digital converters and the second pixel output bus is coupled to a second analog to digital converter of the plurality of analog to digital converters.

6. An image sensor, the image sensor comprising:
a plurality of pixels, each of the plurality of pixels comprising:
a photodiode having an anode and a cathode connected to a constant voltage level;
a first transistor having:
a first input connected to the anode of the photodiode;
a first output connected to a reset bus; and
a first control configured to receive a discharge signal; and
a comparator having:
a second input connected to the anode of the photodiode and the first input of the transistor;
a third input configured to receive a threshold voltage;
a second output coupled to a pixel output bus; and
a second control configured to receive a select signal and control operation of the comparator based on the selection signal;
a second transistor having:
a fourth input coupled to each first output via the reset bus;
a third output configured to be coupled to an energy storage device; and
a third control configured to receive an energy harvest signal.

7. The image sensor of claim 6, further comprising a third transistor having:
a fifth input coupled to each first output via the reset bus;
a fourth output connected to the constant voltage level; and
a fourth control configured to receive a global reset signal, wherein applying the discharge signal and the reset signal simultaneously causes the anode of the photodiode of each pixel of the plurality of pixels to be coupled to the constant voltage level, and wherein the discharge signal and the energy harvest signal simultaneously causes the anode of the photodiode of each pixel of the plurality of pixels to be coupled to the energy storage device.

8. The image sensor of claim 6, wherein the plurality of pixels are arranged in a plurality of rows and a plurality of columns, and wherein the second output of each pixel in a first column of pixels is connected to a first pixel output bus and the second output of each pixel in a second column is connected to a second pixel output bus.

9. The image sensor of claim 8, wherein the second control of each pixel in a first row of pixels is configured to receive a first select signal, and wherein the second control of each pixel in a second row of pixels is configured to receive a second select signal.

10. The image sensor of claim 6, wherein the second control of each pixel in a first row of pixels receives multiple select signals at various times during a signal exposure time.

11. A digital camera comprising:
an energy storage device;
an image sensor, the image sensor comprising:
a plurality of pixels, each of the plurality of pixels comprising:
a photodiode having an anode and a cathode connected to a constant voltage level;
a first transistor having:
a first input connected to the anode of the photodiode;
a first output connected to a reset bus; and
a first control configured to receive a discharge signal; and
a second transistor having:
a second input connected to the anode of the photodiode;
a second output connected to a pixel output bus; and
a second control configured to receive a select signal; and
a third transistor having:
a third input coupled to each first output via the reset bus;
a third output coupled to the energy storage device; and
a third control configured to receive an energy harvest signal; and
a hardware processor that is configured to:
apply the discharge signal during a first time period;
inhibit the discharge signal and the select signal during a second time period;
inhibit the discharge signal during a third time period and apply the select signal during the third time period; and
apply the discharge signal and the energy harvest signal during a fourth time period.

12. The digital camera of claim 11, wherein the hardware processor is further configured to control the duration of the fourth time period based on a voltage of the energy storage device.

13. The digital camera of claim 12, wherein the hardware processor is further configured to control the duration of the fourth time period based on a current that flows into the energy storage device at the beginning of the fourth time period.

14. The digital camera of claim 11, wherein the image sensor further comprises a fourth transistor having:
a fourth input coupled to each first output via the reset bus;
a fourth output connected to the constant voltage level; and
a fourth control configured to receive a global reset signal;
wherein the hardware processor is further configured to apply the reset signal during the first time period.

15. The digital camera of claim 11, wherein the plurality of pixels are arranged in a plurality of rows and a plurality of columns, and wherein the second output of each pixel in a first column of pixels is connected to a first pixel output bus and the second output of each pixel in a second column is connected to a second pixel output bus.

16. The digital camera of claim 15, wherein the hardware processor is further configured to:
apply a first select signal to the first control of each pixel in a first row of pixels, and
apply a second select signal to the first control of each pixel in a second row of pixels.

17. The digital camera of claim 15, further comprising a plurality of analog to digital converters, wherein the first pixel output bus is coupled to a first analog to digital converter of the plurality of analog to digital converters and the second pixel output bus is coupled to a second analog to digital converter of the plurality of analog to digital converters.

18. The digital camera of claim 11, wherein the energy storage device is a rechargeable battery.

19. The digital camera of claim 11, wherein the photodiode of each pixel is a photovoltaic cell, and wherein the image sensor is a large format image sensor.

20. The digital camera of claim 11, wherein the image sensor is a solid-state image sensor.

* * * * *